United States Patent
Smirnov et al.

(10) Patent No.: US 8,982,481 B2
(45) Date of Patent: Mar. 17, 2015

(54) CATADIOPTRIC OBJECTIVE FOR SCATTEROMETRY

(71) Applicant: ASML Holding N.V., Veldhoven (NL)

(72) Inventors: Stanislav Y. Smirnov, Danbury, CT (US); Adel Joobeur, Milford, CT (US); Yevgeniy Konstantinovich Shmarev, Lagrangeville, NY (US); Arun Mahadevan Venkataraman, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 141 days.

(21) Appl. No.: 13/687,630

(22) Filed: Nov. 28, 2012

(65) Prior Publication Data

US 2013/0170049 A1 Jul. 4, 2013

Related U.S. Application Data

(60) Provisional application No. 61/582,093, filed on Dec. 30, 2011, provisional application No. 61/592,231, filed on Jan. 30, 2012.

(51) Int. Cl.
 G02B 17/00 (2006.01)
 G02B 17/08 (2006.01)
 G03F 7/20 (2006.01)

(52) U.S. Cl.
 CPC ............ G02B 17/08 (2013.01); G02B 17/0856 (2013.01); G03F 7/70625 (2013.01); G03F 7/70633 (2013.01); *G02B 17/0892* (2013.01)
 USPC .......................................... 359/731; 359/730

(58) Field of Classification Search
 CPC ............... G02B 17/08; G02B 17/0856; G02B 17/0892; G03F 7/70625; G03F 7/70633
 USPC ................................. 359/726, 727, 730, 731
 See application file for complete search history.

(56) References Cited

U.S. PATENT DOCUMENTS

| 7,633,689 B2 | 12/2009 | Shmarev et al. |
| 2009/0021845 A1 | 1/2009 | Shmarev et al. |
| 2011/0242528 A1 | 10/2011 | Hwang et al. |

FOREIGN PATENT DOCUMENTS

WO  WO 2009/041288 A1  4/2009

OTHER PUBLICATIONS

International Search Report and Written Opinion of the International Searching Authority directed to related International Patent Application No. PCT/EP2012/073929, mailed Feb. 28, 2013; 12 pages.
English-Language Abstract for International Patent Publication No. 2009/041288 A1, published Apr. 2, 2009; 1 page.

*Primary Examiner* — William Choi
(74) *Attorney, Agent, or Firm* — Sterne, Kessler, Goldstein & Fox P.L.L.C.

(57) ABSTRACT

A system and method is described for correcting aberrations caused by field curvature with a catadioptric objective. In one example, a catadioptric optical system includes a first catadioptric element and a second catadioptric element. The first catadioptric element includes a first surface positioned to reflect a beam and a second surface positioned to focus the beam reflected by the first surface. The second catadioptric element is configured to receive the beam reflected by the second surface of the first catadioptric element. The second catadioptric element includes a third surface positioned to reflect the beam, and a fourth reflective surface positioned to focus the beam reflected by the third reflective surface. A curvature of the third or fourth surfaces of the second catadioptric element is chosen to apply a positive contribution to a field curvature associated with the first catadioptric element.

17 Claims, 8 Drawing Sheets

CATADIOPTRIC OBJECTIVE FOR SCATTEROMETRY

BACKGROUND

1. Field

The present invention relates to objective designs within an inspection apparatus usable, for example, in the manufacture of devices by lithographic techniques.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between two layers formed in or on the patterned substrate and critical line width of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-destructive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

With the further shrinking of resist thickness and the introduction of more complicated lithographic stacks (e.g., stacks configured for double exposure), critical dimension (CD) and overlay (OV) metrology performance will also have to improve to monitor the lithographic processes. One way to improve CD metrology performance is to reduce the wavelength of the measurement radiation, for example, ultraviolet radiation. However, OV metrology often requires radiation having near-infrared wavelengths to view overlay targets through different process layers. Accordingly, there is a need for inspection apparatuses, such as scatterometers, that can operate within a spectral band from about 200 nm to about 850 nm to make both CD and OV measurements without compromising optical performance regarding, for example, field of view, pupil aberrations, over all transmission, polarization properties (induced ellipticity), and transmission uniformity. Reduced optical performance can lead to reduced accuracy of the OV and CD measurements, as well as reduced system productivity.

Another way to improve CD and OV metrology performance is to improve the objectives used with inspection apparatuses. There are two types of objectives generally used for scatterometry applications: refractive objectives and catadioptric objectives. One disadvantage of previous refractive objectives is that the working distance is relatively small. For example, the working distance is generally less than 0.35 mm when the numerical aperture (NA) equals about 0.95. Another disadvantage of previous refractive objectives is that the operational wavelength spectral range is limited to about 450-700 nm. Further, previous refractive objectives only have plan apochromatic aberration correction.

One disadvantage of previous catadioptric objectives is that they induce field curvature—previous catadioptric objectives typically have a large Petzval sum that is far from zero and must be corrected for. Previous catadioptric objectives also suffer from obscuration that decreases image contrast. Catadioptric objectives for an inspection apparatus such as a scatterometer must also be corrected for pupil aberrations. Pupil aberrations in the previous catadioptric objectives are large because of large Petzval curvature and pupil size.

SUMMARY

Therefore, what is needed is a catadioptric objective that can correct for aberrations caused by field curvature.

According to an embodiment of the present invention, there is provided a catadioptric optical system configured to receive a beam. The catadioptric optical system includes a first catadioptric element and a second catadioptric element. The first catadioptric element includes a first surface positioned to reflect the beam and a second surface positioned to focus the beam reflected by the first surface. The second catadioptric is configured to receive the beam reflected by the second surface of the first catadioptric element. The second catadioptric element includes a third surface positioned to reflect the beam, and a fourth reflective surface positioned to focus the beam reflected by the third reflective surface. A curvature of the third or fourth surfaces of the second catadioptric element is chosen to apply a positive contribution to a field curvature associated with the first catadioptric element.

According to another embodiment of the present invention, an optical system for scatterometry includes an optical element configured to deflect a beam, and an objective system. The objective system includes a first and second monolithic glass element. The first monolithic glass element includes a first surface that reflects the beam, and a second surface configured to receive the beam from the first surface and to reflect and focus the beam. The second monolithic glass element is configured to receive the beam reflected by the second surface of the first monolithic glass element. The second monolithic glass element includes a third surface configured to reflect the beam, and a fourth surface configured to reflect and focus the beam reflected by the third surface onto a target portion of a substrate. A curvature of the third or fourth surfaces of the second monolithic glass element is chosen to apply a positive contribution to a field curvature associated with the first monolithic glass element.

An exemplary method for correcting aberrations caused by field curvature in an inspection apparatus is also presented. A catadioptric objective including first and second catadioptric elements is provided. The first catadioptric element receives a beam, reflects the beam from a first reflective surface, and focuses the beam reflected by the first reflective surface with a second reflective surface. The second catadioptric element receives the beam reflected by the second reflective surface at a third refractive surface, reflects the beam from a fourth reflective surface, focuses the beam reflected by the fourth surface with a fifth reflective surface, and receives the beam reflected by the fifth reflective surface at a sixth refractive surface. A curvature of at least one of the third, fourth, fifth, and sixth surfaces of the second catadioptric element is chosen to apply a positive contribution to a field curvature associated with the first catadioptric element.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION

The accompanying drawings, which are incorporated herein and form part of the specification, illustrate the present invention and, together with the description, further serve to explain the principles of the invention and to enable a person skilled in the relevant art(s) to make and use the invention.

Figure 4A:
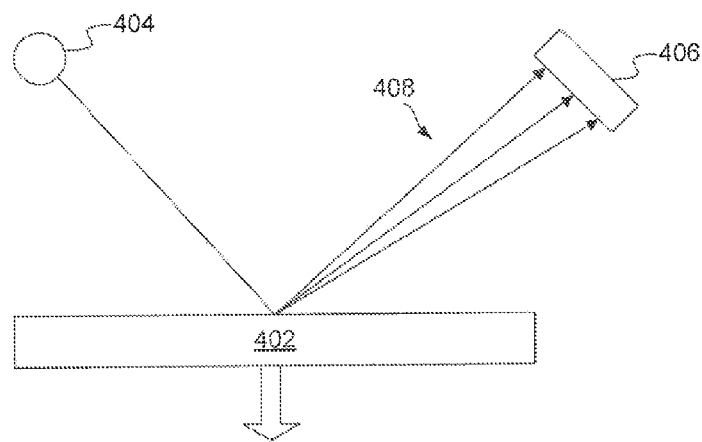
Figure 4B:
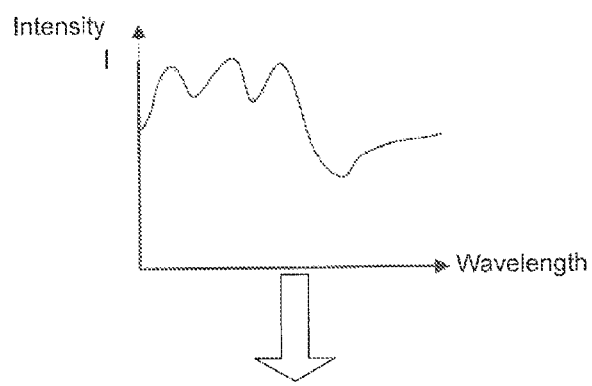
Figure 4C:
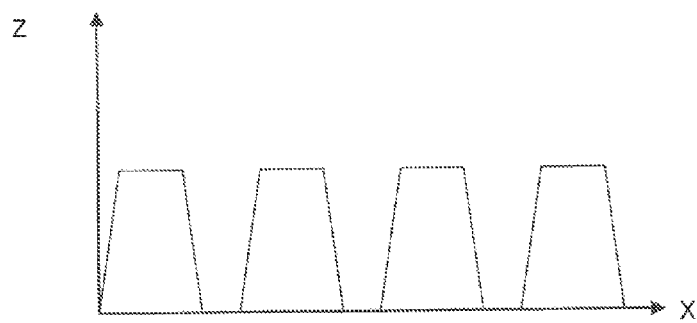

FIGS. 4A-C depict an example scatterometer.

Figure 5:
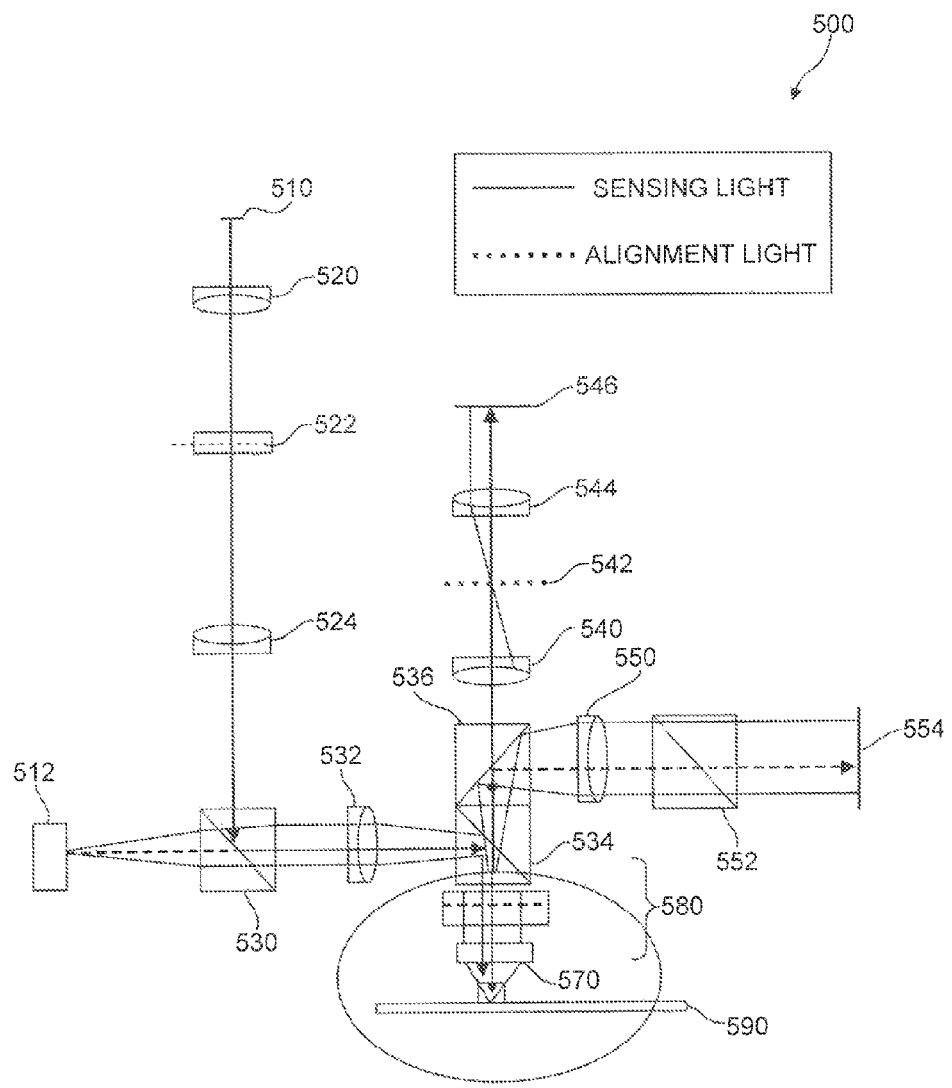

FIG. 5 depicts a sensing and alignment system including a catadioptric optical objective.

Figure 6:
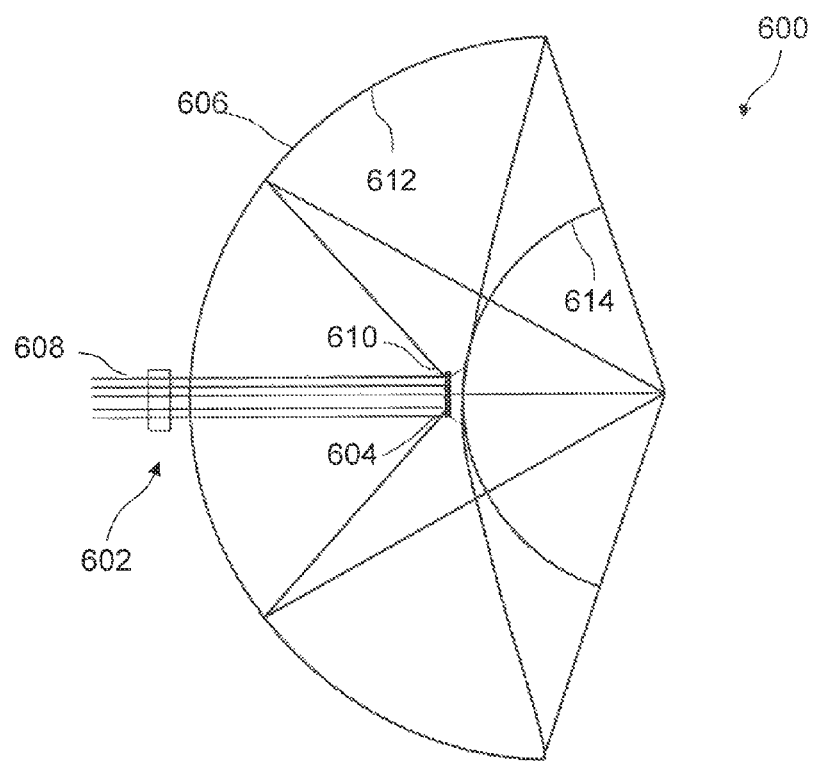

FIG. 6 depicts a catadioptric optical objective.

Figure 7:
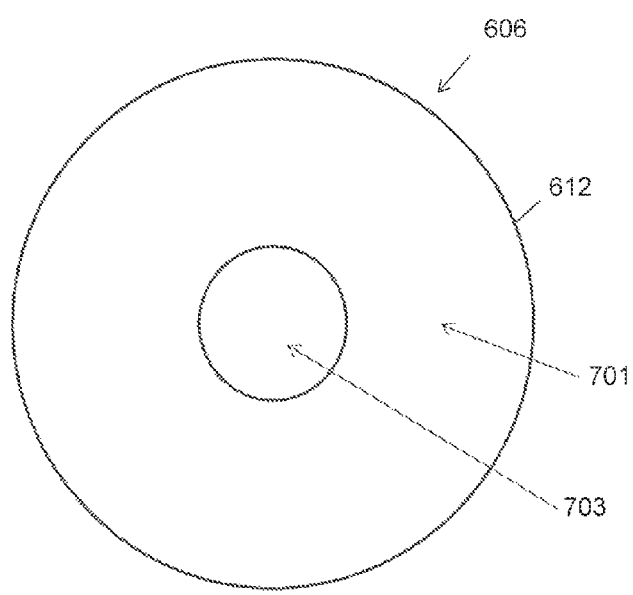

FIG. 7 depicts a plan view of a surface included in the catadioptric optical objective of FIG. 6.

Figure 8:
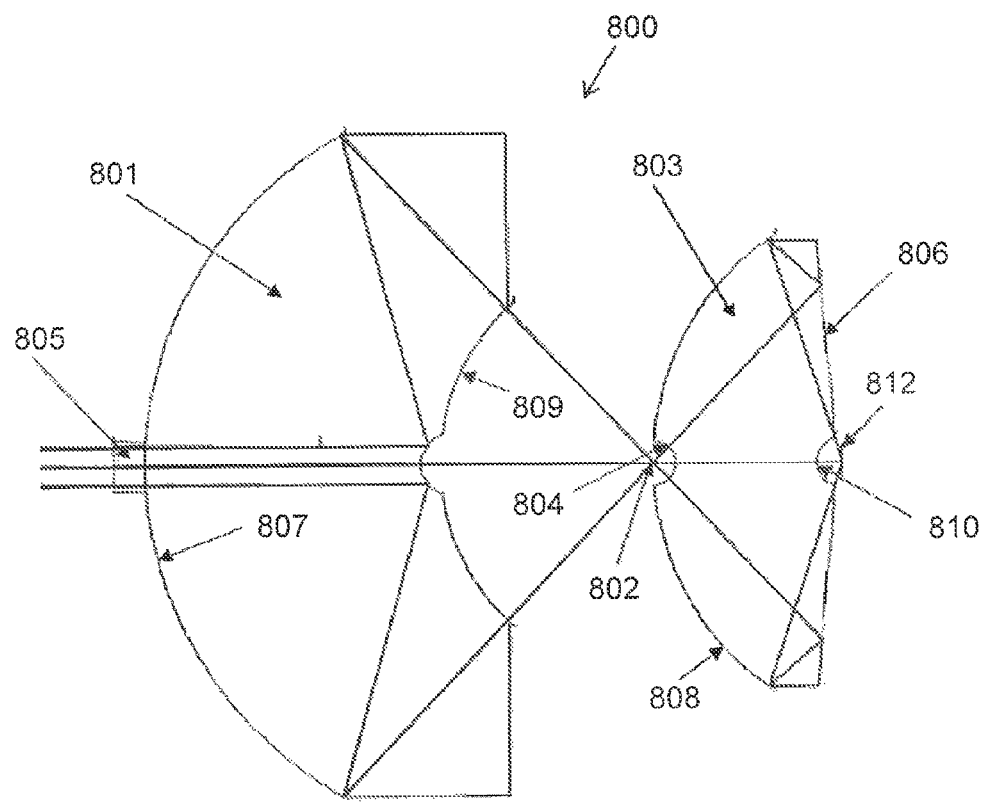
Figure 9:
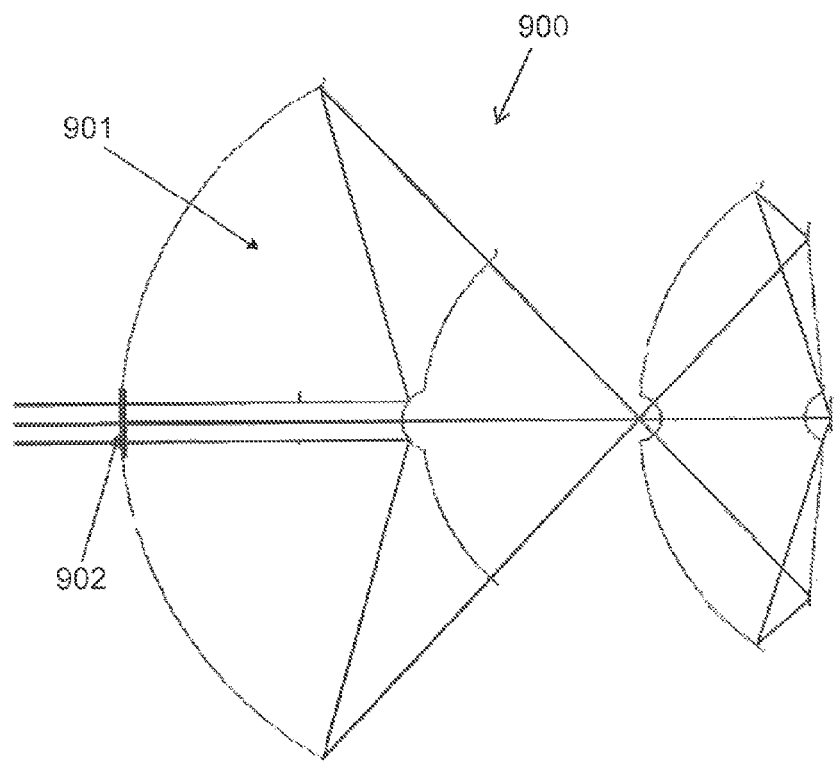

FIGS. 8 and 9 depict various catadioptric optical systems according to various embodiments of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The present invention provides a system and method for correcting aberrations caused by field curvature with a catadioptric objective that may be used within an inspection apparatus such as a scatterometer. In one embodiment, a catadioptric optical system is described for deploying scatterometry in an inspection apparatus such as a scatterometer that is configured for optical metrology and may operate within a spectral band from about 200 nm to about 850 nm to make both critical dimension (CD) and overlay (OV) measurements. Scatterometry is a one of the types of metrology useful for critical dimension CD and OV related metrology. Scatterometry can measure either many diffraction orders or variable incident/collection angles at a single wavelength. In the specification, reference to "one embodiment", "an embodiment", "an example embodiment", etc., indicates that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A catadioptric optical system in accordance with an embodiment of the present invention includes at least (i) a mirror system to provide a high numerical aperture and achromatism, and (ii) a nearly afocal refractive element or surface to correct one or more aberrations (such as coma). The catadioptric optical system may be used as a special objective in a UV-visible scatterometer for critical dimension (CD) and overlay measurements (as depicted, for example, in FIG. 5).

The special objective can be embedded in a system that includes both an alignment branch and a sensing branch. In such an embodiment, the alignment branch includes refractive elements that are embedded in the optical design of the sensing branch. The refractive elements are situated in a volume that is obscured by a small spherical mirror. A first surface (or group of surfaces) in the alignment branch has a common surface (or surfaces) with a convex reflective surface in the sensing branch. The convex reflective surface can be partly reflective (such as, for example, 80% reflection) or have a spectral-dependent reflection that provides light distribution between the sensing and alignment branches. Alternatively, the special objective can be used in a system that only includes a sensing branch.

A catadioptric optical system in accordance with a scatterometer of one or more embodiments of the present invention can have several desirable characteristics over conventional scatterometers. For example, such a catadioptric optical system has a very high numerical aperture (such as, for example, approximately 0.95) and operates in a wide spectral range (such as, for example, approximately 200 nanometers to 1000 nanometers). In addition, such a catadioptric optical system produces low obscuration in the sensing branch (approximately 14%) and no obscuration in the alignment branch. Moreover, such a catadioptric optical system includes fewer optical surfaces in the sensing branch compared to conventional scatterometers, thereby minimizing scattering and ghost images produced in the sensing branch. Furthermore, such a catadioptric optical system has smaller dimensions and weight compared to conventional scatterometers.

Before providing additional details of catadioptric optical systems according to one or more embodiments of the present invention, it is first helpful to describe an example lithography environment and scatterometery system in which such catadioptric optical systems may be used.

Example Lithography Environment

Figure 1:
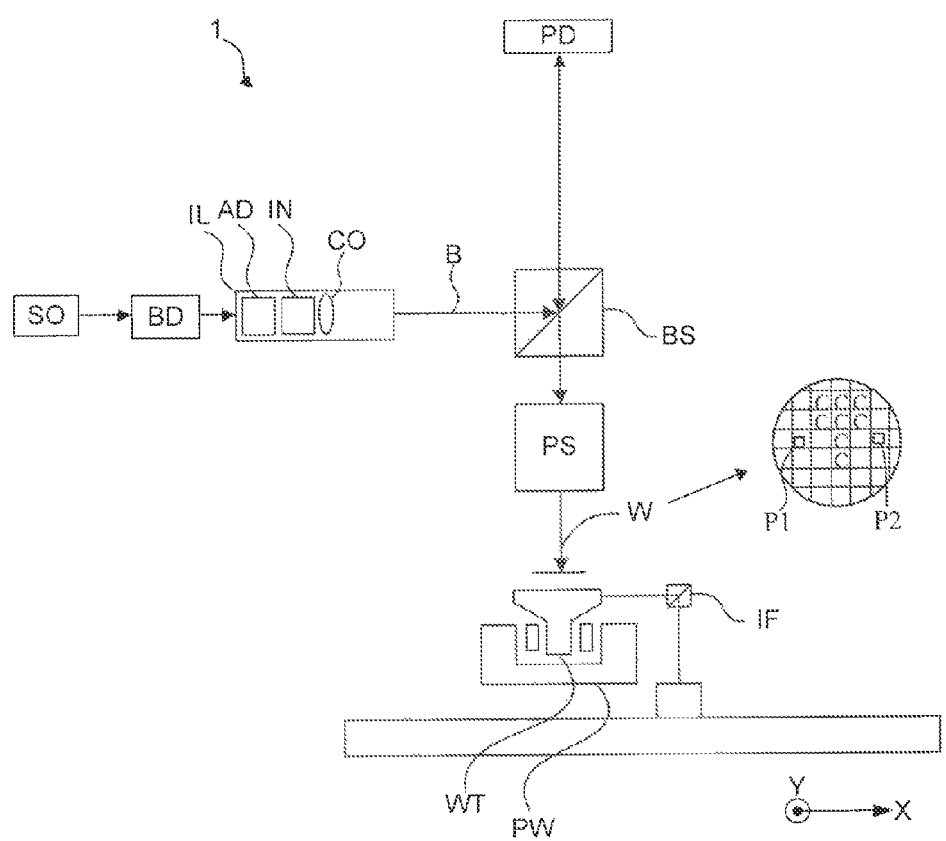
FIGS. 1 and 2 depict lithographic projection apparatus according to embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device composes a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example patterning device is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
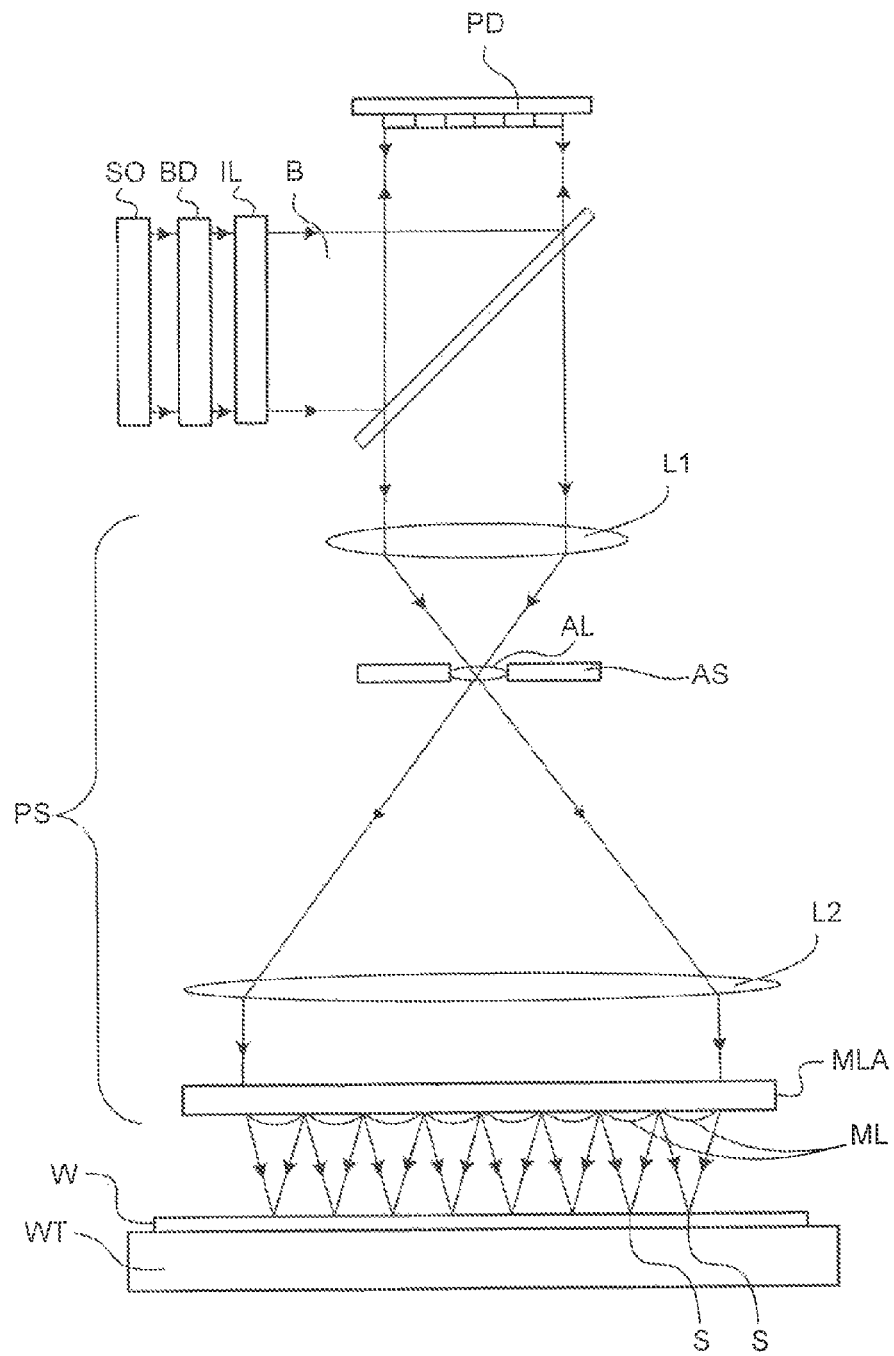

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 3:
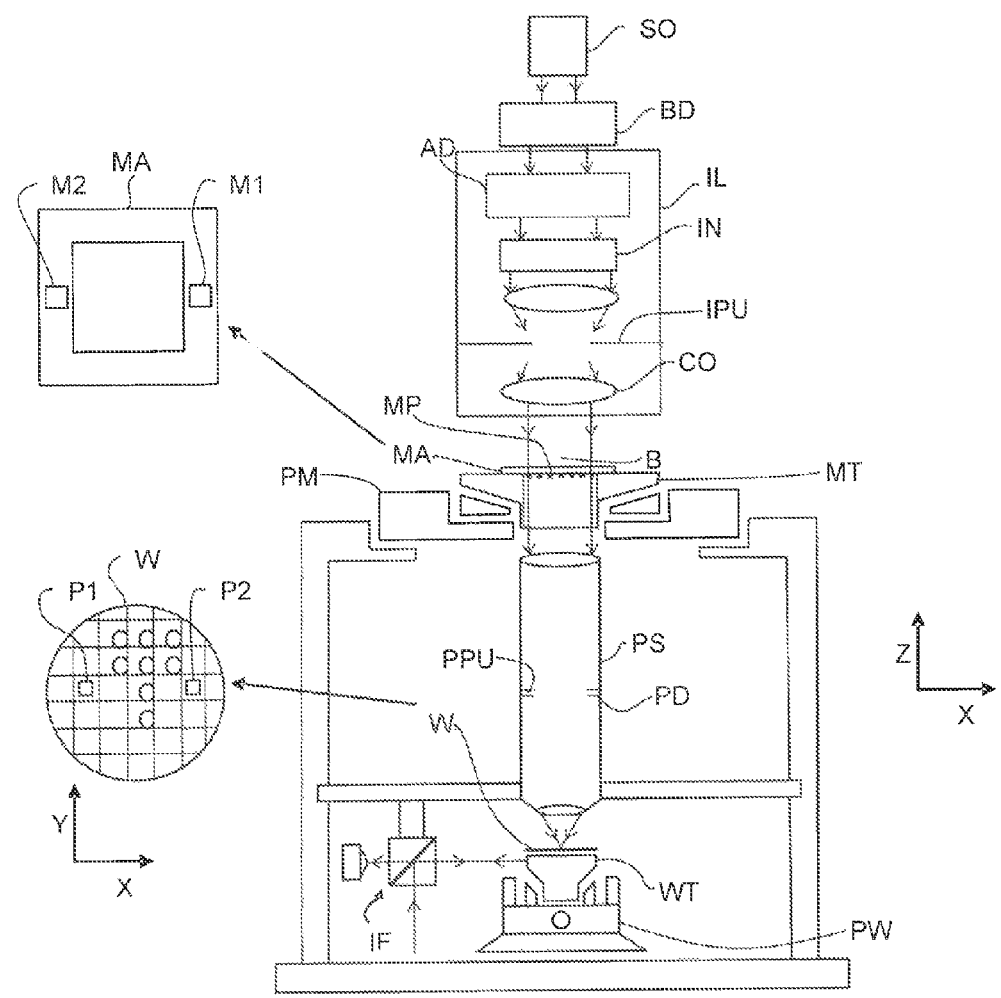
FIG. 3 depicts another lithographic apparatus.

FIG. 3 depicts a lithographic apparatus according to another embodiment of the present invention. Similar to FIGS. 1 and 2 above, the apparatus of FIG. 3 comprises an illumination system IL, a support structure MT, a substrate table WT, and a projection system.

The illumination system IL is configured to condition a radiation beam B (e.g., a beam of UV radiation as provided by a mercury arc lamp, or a beam of DUV radiation generated by a KrF excimer laser or an ArF excimer laser).

The support structure (e.g., a mask table) MT is constructed to support a patterning device (e.g., a mask) MA having a mask pattern MP and connected to a first positioner PM configured to accurately position the patterning device in accordance with certain parameters.

The substrate table (e.g., a wafer table) WT is constructed to hold a substrate (e.g., a resist coated wafer) W and connected to a second positioner PW configured to accurately position the substrate in accordance with certain parameters.

The projection system (e.g., a refractive projection lens system) PS configured to project a pattern imparted to the radiation beam B by the pattern MP of the patterning device MA onto a target portion C (e.g., comprising one or more dies) of the substrate W.

The illumination system IL may include various types of optical components, such as refractive, reflective, and diffractive types of optical components, or any combination thereof, for directing, shaping, or controlling radiation.

The support structure MT supports, i.e., bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT may be a frame or a table, for example, which may be fixed or movable as required. The support structure MT may ensure that the patterning device MA is at a desired position, for example with respect to the projection system PA. Any use of the terms "reticle" or "mask" herein may be considered synonymous with the more general term "patterning device."

As noted above, the term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern MP includes phase-shifting features or so called assist features. Generally, the pattern imparted to the radiation beam B will correspond to a particular functional layer in a device being created in the target portion C, such as an integrated circuit.

Referring to FIG. 3, the illumination system IL receives a radiation beam from a radiation source SO, such as for example a mercury-arc lamp for providing g-line or i-line UV radiation, or an excimer laser for providing DUV radiation of a wavelength of less than about 270 nm, such as for example 248, 193, 1137, and 126 nm. The source SO and the lithographic apparatus may be separate entities, for example when the source SO is an excimer laser. In such cases, the radiation beam B is passed from the source SO to the illumination system IL with the aid of a beam delivery system BD comprising, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam B at mask level. Generally, at least the outer and/or inner radial extent (commonly referred to as σ-outer and σ-inner, respectively) of the intensity distribution in a pupil IPU of the illumination system IL can be adjusted. In addition, the illumination system IL may comprise various other components, such as an integrator IN and a condenser CO. The illumination system IL may be used to condition the radiation beam B, to have a desired uniformity and intensity distribution in its cross section at mask level.

The radiation beam B is incident on the patterning device (e.g., mask MA), which is held on the support structure (e.g., mask table MT), and is patterned by the patterning device MA in accordance with a pattern MP. Having traversed the mask MA, the radiation beam B passes through the projection system PS, which focuses the beam B onto a target portion C of the substrate W.

The projection system has a pupil PPU conjugate to the illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 13) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the mask MA, the mask alignment marks M1 and M2 may be located between the dies.

The depicted apparatus of FIG. 3 could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Example Scatterometry System

A catadioptric optical system in accordance with one or more embodiments of the present invention may be used in a scatterometry system to sense or detect properties of the surface of substrate.

FIG. 4A depicts a scatterometer by which one or more properties of the surface of a substrate 402 may be determined. In an embodiment, the scatterometer comprises a radiation source 404 (e.g., a broadband (white light) radiation source), which directs radiation (or a beam) onto a substrate 402. The reflected radiation is passed to a sensor 406 (e.g., a spectrometer detector) which measures a spectrum 408 (intensity as a function of wavelength) of the specular reflected radiation. From this data, the structure or profile giving rise to the detected spectrum may be reconstructed, e.g., by Rigorous Coupled Wave Analysis and non-linear regression or by comparison with a library of simulated spectra, as shown in FIGS. 4B and 4C. In general, for the reconstruction, the general form of the structure is known and some parameters are assumed from knowledge of the process by which the structure was made, leaving only a few parameters of the structure to be determined from the scatterometry data.

The scatterometer may be a normal-incidence scatterometer or an oblique-incidence scatterometer. Variants of scatterometry may also be used in which the reflection is measured at a range of angles of a single wavelength, rather than the reflection at a single angle of a range of wavelengths.

FIG. 5 depicts a scatterometry system 500 that can sense one or more properties of the surface of wafer 590. System 500 has an alignment branch and a sensing branch that both share a catadioptric optical system 580. To operate properly, the alignment and sensing branches have very different optical specifications, because they use different illumination sources and perform different functions. Importantly, catadioptric optical system 580 functions properly within the optical specifications of both the alignment branch and the sensing branch. In the embodiment depicted in FIG. 5, catadioptric optical system 580 includes an optical element 534 and an objective system 570. The alignment branch, sensing branch, and catadioptric optical system 580 are described in more detail below.

The alignment branch is used to align system 500 with features on a wafer 590. The alignment branch includes an illumination source 512 (such as a wide band light emitting diode (LED)) that provides a first beam of electromagnetic radiation. In an example, the first beam has a spectral range between about 450 nanometers and about 600 nanometers. The first beam passes through optical elements 530 and 532 and then impinges on an optical element 534. From optical element 534, the first beam passes through objective 570 and focuses on a portion of wafer 590. After reflecting from wafer 590, the beam passes back through objective 570 and optical element 534. A beam splitter 536 directs the first beam through a focusing lens 550 and beam splitter 552, and then onto a first sensor 554 (e.g., a charge coupled device (CCD)). The image of wafer 590, provided by sensor 554, is used to align system 500 with specific portions of wafer 590.

The sensing branch is used to sense or detect the features on the aligned portions of wafer 590 according to known scatterometry techniques, such as the scatterometry techniques described above. The sensing branch includes an illumination source 510 (e.g., a tungsten illumination source having an interference filter) that provides a second beam of electromagnetic radiation. In an example, the second beam has a bandwidth of approximately 10 nanometers and falls within the spectral range of approximately 300 nanometers to 800 nanometers. The second beam passes through optical elements 520, 522, 524, 530 and lens 532. Optical element 534 then directs the second beam through objective system 570 and onto an aligned portion of wafer 590. The second beam is reflected and/or refracted by the aligned portion of wafer 590 and directed back through objective system 570 and optical element 534. The second beam also passes through beam splitter 536, lens 540, aperture 542, and lens 544, and then impinges on a second detector 546 (e.g., second CCD). Second detector 546 provides an image of the aligned portion of wafer 590 that is used to detect features on the surface of wafer 590.

As mentioned above, catadioptric optical system 580 includes optical element 534 and objective system 570. Catadioptric optical system 580 is achromatic in a wide spectral range (such as about 200 nanometers to 1000 nanometers). When used in system 500, catadioptric optical system 580 has low obscuration in the sensing branch (such as approximately 14% by radius) and substantially no obscuration in the alignment branch. It has smaller dimensions and weight, and only a few surfaces thereby reducing scatter and eliminating ghost images.

Embodiments of the Catadioptric Optical System

FIG. 6 depicts an exemplary catadioptric optical system 600. As shown in FIG. 6, catadioptric optical system 600 includes a correcting plate 602, a spherical convex mirror 604, and a monolithic glass element 606.

Correcting plate 602 conditions a beam of electromagnetic radiation to correct one or more optical aberrations (such as coma). In one example, correcting plate 602 includes an aspherical surface 608. Correcting plate 602 may comprise one or more refractive elements.

In one example, spherical convex mirror 604 comprises a spherical reflective surface 610 that is positioned to reflect the electromagnetic radiation conditioned by correcting plate 602. In the embodiment depicted in FIG. 6, spherical convex mirror 604 is positioned on a surface 614 of monolithic glass element 606.

As illustrated in FIG. 7, in one embodiment of the present invention aspheric surface 612 of monolithic glass element 606 has a reflective portion 701 and a transparent portion 703, i.e., made of a material that exhibits transparent properties given a specific wavelength of a light beam. In the example show, transparent portion 703 is centered and symmetrical around the optical axis of monolithic glass element 606 and has a diameter that is chosen based upon the width of the input beam given a specific application of the system. Thus, various configurations of element 606 can be provided and chosen from for a specific application. Transparent portion 703 may also be considered to be a refractive portion.

Reviewing both FIGS. 6 and 7, in this example, surface 612 passes a beam coming from correcting plate 602, but reflects rays coming from spherical mirror 604. That is, electromagnetic radiation conditioned by correcting plate 602 passes through transparent portion 703 of surface 612 in monolithic glass element 606 and impinges on spherical convex mirror 604.

In one example, monolithic glass element 606 includes surfaces 610, 612 and 614. Surface 612 of monolithic glass element 606 receives the electromagnetic radiation reflected by spherical convex mirror 604 (surface 610) and reflects this electromagnetic radiation toward a focal point. Before reaching the focal point, the electromagnetic radiation traverses surface 614 of monolithic glass element 606. Importantly, all rays reflecting off of aspheric reflective surface 612 exit monolithic glass element 606 perpendicular to surface 614, and are therefore not refracted by surface 614. As a result, in this example catadioptric optical system 600 is achromatic.

Further description regarding a similar catadioptric design as that depicted in FIG. 6 can be found in an example design of U.S. Pat. No. 7,633,689, which is incorporated by reference herein in its entirety.

Field aberrations may be corrected to an acceptable level given the field of view utilized in the design of catadioptric optical system 600. However, pupil aberrations due to the negative field curvature caused by the large curvature of surface 610 may not be offset by the curvatures of the other surfaces given the depicted design of catadioptric optical system 600. Thus, modifications to the catadioptric system of FIGS. 6 and 7 may be needed, for example as discussed with respect to embodiments shown in FIGS. 8 and 9.

FIG. 8 depicts an example of a catadioptric system 800 according to an embodiment of the invention. Catadioptric system 800 may include a first monolithic glass element 801 and a correcting plate 805. In one example, correcting plate 805 is a lens.

According to an embodiment, catadioptric system 800 further includes a second monolithic glass element 803 positioned to receive radiation reflected from surface 807 of first monolithic element 801. Second monolithic glass element 803 may be positioned downstream of a focal point 802 generated from the focusing of the electromagnetic radiation reflected from surface 807 of first monolithic glass element 801. Catadioptric system 800 may embody the design of an objective used within a scatterometer, such as the scatterometer depicted in FIG. 5. In one example, second monolithic glass element 803 corrects for the negative field curvature created from first monolithic glass element 801. A combined system may include both first and second monolithic glass elements 801 and 803. First and second monolithic glass elements 801 and 803 may be categorized as catadioptric elements. First monolithic glass element 801 may be similar in design to monolithic glass element 606 depicted in FIGS. 6 and 7. Correcting plate 805 may be similar in design to correcting plate 602 depicted in FIG. 6.

In an embodiment, electromagnetic radiation propagates through correcting plate 805 and first monolithic glass element 801 in a similar manner as described above with reference to FIG. 6. The electromagnetic radiation is focused by first monolithic element 801 to an arbitrary focal point 802. Concave surface 804 of second monolithic glass element 803 is positioned to receive the electromagnetic radiation so that the radiation impinges upon surface 804 substantially perpendicular to surface 804. Chromatic aberrations may be reduced by reducing the refraction of the light at surface 804. The electromagnetic radiation transmits through surface 804 and is reflected by surface 806. The electromagnetic radiation is further reflected and focused by surface 808. In an example, surface 808 focuses the electromagnetic radiation to form focal image 812. Focal image 812 may be formed on the surface of a wafer. Alternatively, focal image 812 may be formed on an optical sensor.

As the electromagnetic radiation is reflected and focused by surface 808, it passes through surface 810 before forming focal image 812. Similar to surface 809 of first monolithic glass element 801, the curvature of surface 810 is chosen so that the electromagnetic radiation impinges surface 810 substantially perpendicular to surface 810 before combining at focal image 812. In an embodiment, the curvature of the various surfaces within second monolithic glass element 803 are chosen to offset the negative field curvature generated by first monolithic glass element 801. For example, the curvature of surfaces 804 and 810 may be chosen to apply a positive field curvature.

FIG. 9 illustrates another example of a catadioptric system 900 according to an embodiment of the invention. Catadioptric system 900 is similar to catadioptric system 800 illustrated in FIG. 8, but does not contain a correcting plate 805 upstream from first monolithic glass element 901. As a consequence, a surface 902 is configured to be substantially flat. In an embodiment, surface 902 does not introduce chromatic aberrations to the beam of electromagnetic radiation passing through it due to its flat profile.

In various examples, catadioptric systems as described in either FIG. 8 or FIG. 9 can be designed to work with an object positioned at a finite distance from the system or infinitely far from the system. High transmission of the electromagnetic radiation is possible due to the small number of optical surfaces present in the embodiments described above. In one example, each of the catadioptric designs described herein can work in the wide spectral range, e.g., from about 157 nm to infrared.

Catadioptric optical systems for use in a scatterometer have been described. While various embodiments of the present invention have been described above, it should be understood that they have been presented by way of example only, and not limitation. It will be apparent to persons skilled in the relevant art that various changes in form and detail can be made therein without departing from the spirit and scope of the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A catadioptric optical system comprising:
    a first catadioptric element configured to receive a beam comprising:
        a first reflective surface positioned to reflect the beam, and
        a second reflective surface positioned to focus the beam reflected by the first reflective surface; and
    a second catadioptric element configured to receive the beam reflected by the second reflective surface of the first catadioptric element, comprising:
        a third refractive surface positioned to receive the beam from the first catadioptric element,
        a fourth reflective surface positioned to reflect the beam,
        a fifth reflective surface positioned to focus the beam reflected by the fourth surface, and
        a sixth refractive surface positioned to receive the beam reflected by the fifth surface,
    wherein a curvature of at least one of the third, fourth, fifth, and sixth surfaces of the second catadioptric element is chosen to apply a positive contribution to a field curvature associated with the first catadioptric element, and
    wherein the first and sixth surfaces comprise convex surfaces.

2. The catadioptric optical system of claim 1, wherein the first and second surfaces are surfaces of a monolithic glass element.

3. The catadioptric optical system of claim 1, wherein the third, fourth, fifth, and sixth surfaces are surfaces of a monolithic glass element.

4. The catadioptric optical system of claim 1, wherein the curvature of the third surface is chosen so that the beam impinges the third surface substantially perpendicular to the third surface.

5. The catadioptric optical system of claim 1, wherein the curvature of the sixth surface is chosen so that the beam impinges the sixth surface substantially perpendicular to the sixth surface.

6. The catadioptric optical system of claim 1, wherein an identical one of the catadioptric optical system is included in both a sensing branch and an alignment branch of a scatterometer.

7. A catadioptric optical system comprising:
a first catadioptric element configured to receive a beam comprising:
a first reflective surface positioned to reflect the beam, and
a second reflective surface positioned to focus the beam reflected by the first reflective surface; and
a second catadioptric element configured to receive the beam reflected by the second reflective surface of the first catadioptric element, comprising:
a third refractive surface positioned to receive the beam from the first catadioptric element,
a fourth reflective surface positioned to reflect the beam,
a fifth reflective surface positioned to focus the beam reflected by the fourth surface, and
a sixth refractive surface positioned to receive the beam reflected by the fifth surface,
wherein a curvature of at least one of the third, fourth, fifth, and sixth surfaces of the second catadioptric element is chosen to apply a positive contribution to a field curvature associated with the first catadioptric element, and
wherein at least a portion of the second surface is located substantially in a center of the second reflective surface is refractive.

8. The catadioptric optical system of claim 7, wherein the beam is received by the first catadioptric element through the refractive portion of the second surface.

9. A catadioptric optical system comprising:
a first catadioptric element configured to receive a beam comprising:
a first reflective surface positioned to reflect the beam, and
a second reflective surface positioned to focus the beam reflected by the first reflective surface;
a second catadioptric element configured to receive the beam reflected by the second reflective surface of the first catadioptric element, comprising:
a third refractive surface positioned to receive the beam from the first catadioptric element,
a fourth reflective surface positioned to reflect the beam,
a fifth reflective surface positioned to focus the beam reflected by the fourth surface, and
a sixth refractive surface positioned to receive the beam reflected by the fifth surface,
wherein a curvature of at least one of the third, fourth, fifth, and sixth surfaces of the second catadioptric element is chosen to apply a positive contribution to a field curvature associated with the first catadioptric element; and
a refractive element positioned upstream from the first catadioptric element.

10. An optical system for scatterometry, comprising:
an optical element configured to deflect a beam; and
an objective system comprising:
a first monolithic glass element configured to receive the deflected beam, the first monolithic glass element comprising:
a first surface that reflects the beam, and
a second surface configured to receive the beam from the first surface and to reflect and focus the beam; and
a second monolithic glass element configured to receive the deflected beam reflected by the second surface of the first monolithic glass element, comprising:
a third surface positioned to receive the beam from the first monolithic glass element,
a fourth surface positioned to reflect the beam,
a fifth surface positioned to reflect and focus the beam reflected by the fourth surface onto a target portion of a substrate, and
a sixth surface positioned in the path of the beam reflected by the fifth surface, between the fifth surface and the substrate,
wherein a curvature of the third, fourth, fifth, or sixth surfaces of the second monolithic glass element is chosen to apply a positive contribution to a field curvature associated with the first monolithic glass element, and
wherein the first and sixth surfaces comprise convex surfaces.

11. The optical system of claim 10, wherein the optical element comprises:
a tilted surface configured to reflect the beam, the tilted surface having a hole therein; and
an aspheric surface configured to reflect the beam reflected by the tilted surface, thereby causing the beam to pass through the hole in the tilted surface and impinge upon the first surface of the first monolithic glass element.

12. The optical system of claim 10, wherein the curvature of the third surface is chosen so that the beam impinges the third surface substantially perpendicular to the third surface.

13. The optical system of claim 10, wherein the curvature of the sixth surface is chosen so that the beam impinges the sixth surface substantially perpendicular to the sixth surface.

14. An optical system of claim 11, for scatterometry, comprising:
an optical element configured to deflect a beam; and
an objective system comprising:
a first monolithic glass element configured to receive the deflected beam, the first monolithic glass element comprising:
a first surface that reflects the beam, and
a second surface configured to receive the beam from the first surface and to reflect and focus the beam; and
a second monolithic glass element configured to receive the deflected beam reflected by the second surface of the first monolithic glass element, comprising:
a third surface positioned to receive the beam from the first monolithic glass element,
a fourth surface positioned to reflect the beam,
a fifth surface positioned to reflect and focus the beam reflected by the fourth surface onto a target portion of a substrate, and
a sixth surface positioned in the path of the beam reflected by the fifth surface, between the fifth surface and the substrate,
wherein a curvature of the third, fourth, fifth, or sixth surfaces of the second monolithic glass element is chosen to apply a positive contribution to a field curvature associated with the first monolithic glass element, and
wherein at least a portion of the second surface is located substantially in a center of the second surface is refractive.

15. A method for correcting aberrations caused by field curvature in an inspection apparatus, the method comprising:

providing a catadioptric objective in the inspection apparatus for enabling optical metrology, the catadioptric objective including first and second catadioptric elements;

receiving a beam at the first catadioptric element, the first catadioptric element including first and second reflective surfaces;

reflecting the beam from the first reflective surface;

focusing the beam reflected by the first reflective surface with the second reflective surface;

receiving the beam reflected by the second reflective surface of the first catadioptric element at the second catadioptric element, the second catadioptric element including a third refractive surface, a fourth reflective surface, a fifth reflective surface, and a sixth refractive surface;

receiving the beam from the first catadioptric element at the third refractive surface;

reflecting the beam from the fourth reflective surface;

focusing the beam reflected by the fourth reflective surface with the fifth reflective surface; and receiving the beam reflected by the fifth reflective surface at the sixth refractive surface;

wherein a curvature of at least one of the third, fourth, fifth, and sixth surfaces of the second catadioptric element is chosen to apply a positive contribution to a field curvature associated with the first catadioptric element, and wherein the first and sixth surfaces comprise convex surfaces.

16. The method of claim 15, wherein the first and second surfaces are surfaces of a monolithic glass element.

17. The method of claim 15, wherein the third, fourth, fifth, and sixth surfaces are surfaces of a monolithic glass element.

* * * * *

UNITED STATES PATENT AND TRADEMARK OFFICE
CERTIFICATE OF CORRECTION

PATENT NO. : 8,982,481 B2
APPLICATION NO. : 13/687630
DATED : March 17, 2015
INVENTOR(S) : Smirnov et al.

Page 1 of 1

It is certified that error appears in the above-identified patent and that said Letters Patent is hereby corrected as shown below:

In the claims,
In Column 20, line 36, claim 14, please delete "of claims 11".

Signed and Sealed this
Third Day of November, 2015

Michelle K. Lee
*Director of the United States Patent and Trademark Office*